(12) United States Patent
Keogh (10) Patent No.: US 6,883,714 B2
(45) Date of Patent: Apr. 26, 2005

(54) METHODS OF OPTICAL FILAMENT SCRIBING OF CIRCUIT PATTERNS WITH PLANAR AND NON-PLANAR PORTIONS

(75) Inventor: Raymond S. Keogh, Farmingdale, NY (US)

(73) Assignee: Stratos Lightwave, Inc., Chicago, IL (US)

( * ) Notice: Subject to any disclaimer, the term of this patent is extended or adjusted under 35 U.S.C. 154(b) by 304 days.

(21) Appl. No.: 10/207,933

(22) Filed: Jul. 29, 2002

(65) Prior Publication Data

US 2003/0010065 A1 Jan. 16, 2003

Related U.S. Application Data

(63) Continuation-in-part of application No. 09/211,511, filed on Dec. 14, 1998, now abandoned.

(51) Int. Cl.$^7$ ............................................. G06K 19/00
(52) U.S. Cl. ...................................... 235/487; 235/491
(58) Field of Search ................................ 235/487, 491, 235/492, 375

(56) References Cited

U.S. PATENT DOCUMENTS

| | | |
|---|---|---|
| 3,674,602 A | 7/1972 | Keogh et al. |
| 3,674,914 A | 7/1972 | Burr |
| 4,450,623 A | 5/1984 | Burr |
| 4,533,787 A | 8/1985 | Anderegg et al. |
| 5,259,051 A | 11/1993 | Burack et al. |
| 5,292,390 A | 3/1994 | Burack et al. |
| 5,483,603 A | 1/1996 | Luke et al. |
| 5,982,628 A | 11/1999 | Hondeau et al. |
| 6,068,192 A | 5/2000 | McCabe et al. |
| 6,088,230 A | 7/2000 | Finn et al. |
| 6,161,761 A | 12/2000 | Ghaem et al. |
| 6,172,926 B1 | 1/2001 | Drayer ........................ 365/215 |
| 6,173,899 B1 | 1/2001 | Rozin |
| 6,233,818 B1 | 5/2001 | Finn et al. |
| 6,370,219 B1 | 4/2002 | Peale ........................ 378/28 |

FOREIGN PATENT DOCUMENTS

| | | |
|---|---|---|
| AU | 079049 | 9/1997 |
| DE | 196 19 771 A1 | 8/1997 |
| EP | 0 080 756 A1 | 6/1983 |
| JP | 05-258131 | 10/1993 |
| WO | 95/00416 | 3/1995 |
| WO | WO 95/26538 | 10/1995 |
| WO | WO 97/30418 | 8/1997 |

OTHER PUBLICATIONS

International Search Report dated May 4, 2004, PCT/US03/23674.

*Primary Examiner*—Karl D. Frech
(74) *Attorney, Agent, or Firm*—Bell, Boyd & Lloyd LLC (57) ABSTRACT

Methods of forming optical filament circuit patterns with planar and non-planar portions are provided. An optical filament circuit pattern is scribed by moving a filament guide and a substrate relative to one another at a speed between about 110 inches/minute and about 190 inches/minute, and dispensing an optical filament on, or in the vicinity of, a surface of the substrate. The filament or the substrate or both have adhesive surface(s). The adhesive surface is capable of being adhesively actuated by application of energy. Energy is applied simultaneous with, or subsequent to, scribing. Preferably, ultrasound energy is applied having an output power between about 2.0 watts and about 3.5 watts while applying a pressure to the filament between about 1.177 Newtons and about 1.324 Newtons. A portion of the filament circuit pattern is planar and another portion is non-planar. The non-planar portion traverses but does not contact or adhere to a pre-selected area of the substrate. The pre-selected area corresponds with a pad, a contact pattern, a hole, a slot, a raised feature, a part of the previously scribed planar portion of the pattern, and a filament termination point. Alternately, the non-planar portion may be embedded below the surface of the substrate. Another planar portion of the filament circuit traverses the non-planar portion but does not contact or adhere to a pre-selected part of the previously scribed non-planar portion. Optical filament-scribed circuit boards are formed by this method.

17 Claims, 9 Drawing Sheets

METHODS OF OPTICAL FILAMENT SCRIBING OF CIRCUIT PATTERNS WITH PLANAR AND NON-PLANAR PORTIONS

This application is a continuation-in-part application of U.S. application Ser. No. 09/211,511, filed Dec. 14, 1998, now abandoned, the entirety of which is incorporated herein by reference.

FIELD OF THE INVENTION

The present invention relates to optical filament circuit boards and methods of their manufacture. More particularly the present invention relates to an improved method of adhering optically conductive filaments onto dielectric substrates to form filament circuit patterns with both planar and non-planar portions and interconnection cards, Smart Cards or optical filament circuit cards formed therefrom.

BACKGROUND OF THE INVENTION

In the manufacture and assembly of electric and electronic units, wiring boards have long been used to interconnect electronic components. These "interconnection" boards or cards have an insulating substrate with a plurality of electronic components, which may be integrated circuit packages, or other types of electronic, electro-optical or optical components, mounted thereto and a pattern of conductive path segments connecting components to one another.

Because optical filaments or optical fibers can transmit much more information (and with significantly less signal degradation) than electrical conductors, their use is growing. For example, optical backplanes increasingly are used in electronics systems where greater circuit density is desired, but is difficult to provide with known electrically wired backplanes. An optical backplane is formed by a plurality of optical filaments mounted or routed on a substrate in a given pattern or circuit geometry. Optical backplanes interconnect optical circuit components, which transmit signals optically, as well as electrical circuit components, wiring boards, modules and/or integrated circuits. When an optical backplane interconnects electrical components, the electrical energy of each component is translated to optical energy which is transmitted by optical filaments on the optical backplane to another electrical component where it is translated back to electrical energy for transmission to the other electrical component.

Optical backplanes are fabricated according to various methods, ranging from laying the optical filaments on the substrate by hand to routing the optical filaments in a given pattern onto the substrate by mechanized apparatus. However, commercial interconnection card manufacture with optical filaments is difficult and these known methods often lead to unacceptable results. Optical filaments are extremely small and difficult to handle. These tiny filaments also are fragile, and often cannot withstand stresses attendant to abrupt turns or the like during the scribing process. Optical filament breakage at crossovers (i.e., where one wire overlaps itself or another wire) is particularly problematic, because stresses at these points can increase dramatically. This can be even more troublesome when ultrasonic energy is used to adhere the filaments to the substrate, which can lead to further filament breakage. As breakage rates increase, the commercial viability of optical filament circuit board manufacture decreases.

For example, U.S. Pat. Nos. 3,674,602 and 3,674,914, both dated Jul. 4, 1972, describe interconnection card manufacturing methods. According to these methods, a substrate is mounted on a vacuum table. Then a wire is scribed onto a substrate surface in a pre-selected planar circuit pattern using a wire dispensing and bonding head. This method is known as "wire-scribing." An adhesive film laminated to the substrate surface secures the wire to the substrate. Energy emitted by the bonding head actuates the adhesive film as the wire contacts therewith, so that the wire bonds to the substrate.

However, during wire scribing, the stresses can be so severe (reaching up to up to 12 MPa at crossovers) that the wire conductor ruptures. In fact, U.S. Pat. No. 5,483,603, issued to Luke et al. and dated Jan. 9, 1996, describes a system and method of automatic optical inspection of wire-scribed circuit boards to detect breakage. Similarly, the stress on optical filaments during scribing increases the possibility of breakage, and "microbending," a condition that causes signal attenuation along the optical filament.

U.S. Pat. Nos. 6,088,230 and 6,233,818, dated Jul. 11, 2000 and May 22, 2001, respectively, describe other methods of bonding wire conductor to a substrate or chip-mounting board. The '230 patent discloses that a chip is mounted onto a substrate by an adhesive layer applied to the substrate. Then, a free wire end is connected to a chip contact surface by soldering. Then the coil wire is dispensed onto the substrate surface. At least at some points the wire is fused to the substrate. Finally, a second free wire end is connected to another chip contact surface by soldering. The '818 patent discloses a similar method, which allegedly is applicable to glass fibers, in additional to metallic conductors. However, the '230 patent and the '818 patent fail to describe a single embodiment using optical filaments or provide process parameters for successfully scribing optical filaments according to these methods.

U.S. Pat. No. 5,259,051 to Burack et al., dated Nov. 2, 1993, discloses a method of making optical filament interconnections by routing optical filaments on a substrate. Because the scribing head is capable of X, Y and Z-axis motion, crossovers can be formed. A spring pushes the scribing head down onto the substrate and permits the head to be pushed up at crossovers when obstacles are encountered. Z-axis movement at the optical filaments is not controlled, but instead relies on resistance caused by the obstacles encountered during scribing.

Also, the optical filaments are not embedded into the substrate in the method of the '051 patent, but rather are laid onto the substrate's surface. Accordingly the optical filaments are covered after routing by a plastic sheet that encapsulates the fibers. The sheet is laminated onto the substrate by application of pressure and heat. This pressure, which is necessary to encapsulate the optical filaments, also may break the optical filaments. Breakage is especially a problem at crossovers, which are increasingly common and necessary in optical filament circuit cards.

U.S. Pat. No. 5,292,390 to Burack et al., dated Mar. 8, 1994, discloses a similar method of producing optical circuits. Optical filaments first are bonded to a substrate's upper surface and then are covered with a thermoplastic sheet material. The resulting structure then is compressed at an elevated temperature and relatively high pressure to bond or tack the thermoplastic material to the plastic substrate. After cooling, the structure again is heated and subjected to elevated pressure to cause the thermoplastic material to encase the optical filaments. Again, the fibers in this method still are susceptible to damage, particularly when many crossovers are included in the optical filament circuit pattern, because heat and pressure are applied to the thermoplastic sheet material.

Accordingly, there has been a long-felt need in the industry for methods of manufacturing optical filament circuit boards that are amenable to mass production. Various machines are available for automatically routing and bonding electrical wire to a substrate, but, in general, these machines cannot be adopted for optical filament use because optical filament is relatively fragile and is relatively unable to withstand heat and pressure, abrupt turns, etc.

OBJECTS OF THE INVENTION

It is, therefore, an object of the present invention to provide a method of forming an optical filament circuit pattern having planar and non-planar portions in a quick, cost-effective manner that is amenable for mass production.

A further object is to provide a method of making optical filament scribed circuits that avoids filament breakage and the like by reducing stress on the filaments during manufacture.

A still further object of the present invention is to provide optical filament scribed circuits made with one or more crossovers that are essentially free of stresses.

Another object of the present invention is to provide a method of making wire-scribed circuits without using thick, high performance insulation layers.

An additional object of the present invention is to provide a method of making wire-scribed circuits without using insulation layers that are difficult to remove.

Yet another object of the present invention is to provide wire-scribed circuit boards that do not require filaments with thick, heavy polyimide insulation coatings to withstand the manufacturing process.

Yet still another object of the present invention is to provide wire-scribed circuit boards with filaments having thin polyurethane insulation coatings.

Still a further object of the present invention is to provide Smart Cards with smooth and uniform exteriors, such that subsequently they may be printed with, for example, digitized portraits.

These and other objects of this invention will be apparent to those skilled in the art upon reference to the following specification and claims.

SUMMARY OF THE INVENTION

In one aspect, the present invention concerns methods of optical filament scribing circuit patterns with planar and non-planar portions on or in the vicinity of a dielectric substrate. A pre-selected length of a continuous optically conductive filament is scribed at a speed between about 110 inches/minute and about 190 inches/minute in a plane parallel to the substrate's surface onto or in the surface's vicinity to form a planar portion of the circuit pattern from the scribed length of filament. A non-planar portion of the circuit pattern is formed by placing a next pre-selected length of the continuous filament that is contiguous to the immediately preceding scribed length so that the next pre-selected filament length traverses but does not adhere to a pre-selected surface or feature forming part of the substrate's surface. Then, a next pre-selected length of the continuous filament is scribed at a speed between about 110 inches/minute and about 190 inches/minute onto or in the surface's vicinity to form another planar filament circuit portion. This next pre-selected length of filament is contiguous to the length of the filament that forms the non-planar filament circuit portion.

It has been found that the present invention allows the scribing of fragile optical filaments at speeds heretofore unachievable. To avoid breakage, the energy applied to bond the optical filament to the substrate had been kept to a minimal amount necessary to achieve a sufficient bond. However, when the scribing speed and the amount of bonding energy (e.g., ultrasonic energy and pressure) are increased in tandem, a surprising result is achieved. An unexpectedly strong bond between the optical filament and the substrate is achieved without increasing damage to the filaments. This permits viable commercial manufacture of the optical filament circuit boards.

Additional features and advantages of the present invention will become apparent as the invention is more fully described in the following description, from the drawings, and from the claims. The description is purely illustrative and non-limiting.

DETAILED DESCRIPTION OF THE INVENTION

According to the present invention, methods of optical filament scribing circuit patterns with planar and non-planar portions and interconnection cards, Smart Cards or optical filament circuit cards formed therefrom are provided.

Interconnection cards, Smart Cards and optical filament circuit cards have filament circuits scribed and adhered to an insulating substrate. A plurality of conductive filaments scribed form the filament circuit patterns. Each filament is scribed continuously and adhered to the substrate from one filament end to the other filament end, one filament after the other, until a complete filament circuit pattern is scribed. Electronic, electro-optical or optical components may be present on the substrate's surface.

Any conductive filament may be used, including electrically and optically-conductive filaments. For example, metallic or electrically conductive wire, such as copper wire, may be used. Insulation may be provided surrounding the filament.

The optically conductive filament or optical filament can be a single-mode or multi-mode optical filament. The optically conductive filament may be made of any transparent dielectric material, usually glass or plastic, that guides light. A typical optical filament is constructed from three parts: a core, a cladding and a protective jacket. The core, or central portion, of the filament is the actual propagating path for the light. Bonded to the core is a cladding layer.

The core and the cladding may be constructed from the same or different materials, such as optically conductive glasses or crystals. For example, both the core and the cladding may be composed of silica, or doped silica as well as other silica containing or similar optically-conductive materials. However, it is understood that other materials may be employed as known by those skilled in the art. Illustrative examples of some other materials that may be used are chalcogenide, fluoride, oxyhalide, and tellurite glasses doped with rare-earth ions (i.e., neodymium-doped tellurite glass or a erbium-doped fluoride glass). The core and cladding materials should be chosen so that the refractive index of the core is slightly higher than that of the cladding. By making the refractive index of the core slightly higher than the refractive index of the cladding, light is confined and propagated within the core.

The protective jacket typically, but not always, is provided to protect the clad filament. The jacket may be a suitable polymer (often referred to as a buffer coat), or it may be a plastic jacket. For example, the clad optical filament may be surrounded by a buffer coat made of polyacrylates, polyimides, polymethacrylates, polyurethanes and vinyl ethers.

The tensile strength of the optical filament can be measured according to various well-known techniques. A preferred method of testing tensile strength is disclosed in G. S. Glaesemann and D. J. Walter, "Method Of Obtaining Long-Length Strength Distribution For Reliability Prediction," *OPTICAL ENGINEERING*, Vol. 30, No. 6, pp. 746–748 (June 1991), the disclosure of which is incorporated herein by reference to the extent it is necessary to understand the invention. Preferably, the optical filament has a tensile strength of at least about 100 kpsi when tested according to this method.

Where a portion of filament is assigned to traverse another portion of filament (a "crossover"), insulation is required on metallic conductive filaments to avoid unwanted electrical connections. Insulation is optional for optical conductive filaments.

The adhesive coating and one or more underlying insulation layer(s), if present, should be removable. Electrical connections between the scribed filament and components are made by removing the insulation and/or adhesive. Therefore, the adhesive coating and insulation layer(s) should be able to be removed without damaging the filament or the substrate surface to which the filament is bonded. Preferably, the insulation is a thermoplastic material that is readily removable at normal soldering temperatures.

The substrate forms a base of the interconnection card and provides structural strength and support. Any conventional substrate may be used. For example, the substrate can include: (1) a circuit substrate with or without etched foil power and ground conductors or the like, or (2) an electronic interconnection board, including a discrete-wired circuit board, a standard printed circuit board, a multilayer circuit board; a circuit board with components thereon, or a circuit board at any other stage of construction. The substrate may be made of any dielectric material including phenolic-paper laminates, epoxy-paper laminates, epoxy-glass laminates, epoxy-glass composite laminates, polyimide laminates, triazine resin laminates and other base materials having adequate thermal and electrical properties. The substrate material should have sufficient rigidity, strength and thickness to meet the requirements of the final interconnection board.

Wiring scribing requires that the substrate or the filament have an energy activateable adhesive surface. The filament or the substrate may be composed of a material with such properties. Alternately, the filament or the substrate may be provided with an adhesive coating. Wire scribing adhesives are well known in the art, and have been described in U.S. Pat. Nos. 4,642,321 to Schonberg et al., 4,544,801 to Rudik et al. and 5,340,946 to Friedrich et al. An activateable adhesive coating may be applied to the substrate, such as a partially cured thermosetting resin which, when heated, becomes malleable and provides an adhesive bond when briefly heated. Alternately, the adhesive coating is provided to the filament.

Any suitable adhesive material capable of attaching the filament and the substrate may be used. One example of a suitable material is a pressure sensitive acrylic adhesive tape.

Figure 1:
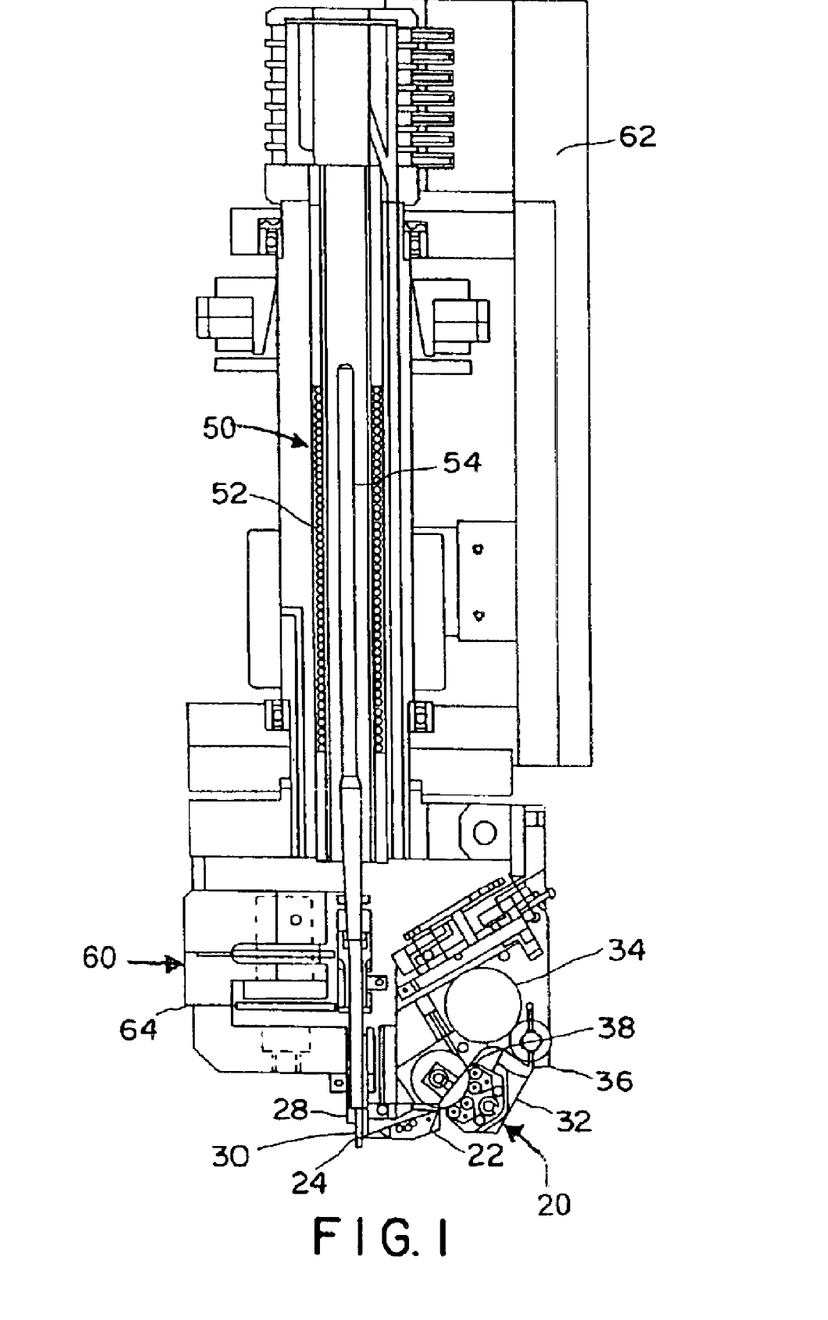
FIG. 1 is a schematic of a device for manufacturing three-dimensional filament circuit boards.

FIG. 1 depicts a schematic of an embodiment of an apparatus for practicing the present invention. An electro-mechanical wire feeding mechanism 32 is adapted to dispense a filament 102 towards a wiring head 20. The wire feeding mechanism 32 may consist of a feeder motor 34 coupled to a capstan or drive wheel 36. The capstan 36 is manufactured with a groove 26 made at close tolerance to the filament 102. Precision bearings 38 are situated to press the filament toward the wiring head 20. When the feeder motor 34 is actuated, the capstan 36 rotates and the filament 102 is forced to move into a filament guide 22 of the wiring head 20. Where the feeder motor 34 is a DC motor, the filament is fed at a velocity that is proportional to the DC voltage applied.

The wiring head 20 has the aforementioned filament guide 22, as well as a stylus 24, and a transducer assembly 50. The filament guide 22 and stylus 24 are preferably manufactured with grooves 26 formed at close tolerance to the outer diameter of the filament. The filament 102 passes from the wire feeding mechanism 32 to the filament guide 22, and is presented beneath the groove 26 of the stylus 24. The grooves of the stylus tip and the filament guide prevent any deviation of the filament position from a true path. The transducer 54 is positioned near the stylus tip 24 and applies energy to either the dispensed filament 102 or to the nearby substrate 106. The energy adheres at least the dispensed portion of the filament to the substrate.

The energy used to activate the adhesive surface should be controllable in magnitude and intensity. The level of the energy should activate the adhesive, but not to damage the filament 102 or the substrate surface 106. Thermal, pressure, ultrasonic, laser or radiant energy sources or combinations thereof, may be used. For example, the adhesive may also be activated chemically using a solvent directed at a portion of the adhesive surface. Alternatively, heated or superheated gasses such as air may be directed at the coating to supply thermal energy to activate the adhesive.

FIG. 1 illustrates a preferred ultrasonic transducer assembly. The transducer assembly 50 has a solenoid 52 that excites a magnetostrictive transducer 54 situated in the center of the solenoid 52 such that the transducer 54 mechanically oscillates at resonant frequency when current is applied to the solenoid 52. The mechanical motion of the transducer 54 is transmitted to a stylus tip 24 attached to the transducer 54 such that the tip 24 oscillates. The amplitude of the tip oscillation is proportional to the amplitude of the current applied to the solenoid 52. The tip 24 is rigidly supported by a bushing 28 or other support member such that deflection from true position is prevented.

Any conventional controller may be used to regulate the amount of energy applied to activate the adhesive surface.

An actuator assembly 60 displaces the wiring head 20 and the substrate 106 relative to one another along three orthogonal axes. Conventional motion platforms for this purpose are typically rotationally displaceable about their respective axes by hydraulic or pneumatic actuators. It will be understood, that either the substrate or the wiring head or both may be mounted on such motion platforms. Alternately, the substrate fixed on to the motion platform capable of movement in only two directions (X and Y). The wiring head is moved along the (Z) axis. Thus, three axes (X,Y,Z) displacement of the wiring head relative to the substrate is possible. Any conventional means for three-dimensional movement may be used.

Preferably, an actuator assembly 60 moves the wiring head 20 both laterally and vertically. More preferably, the actuator assembly 60 displaces the stylus 24 and the filament guide 22 independently of one another. For example, when the adhesive is pressure sensitive, the actuator assembly 60 preferably regulates the pressure exerted upon the filament by the stylus 24. An electronic or pneumatic system 62 positions the wiring head 20 including the stylus tip 24 and controls pressure applied to clamp the filament against the substrate 106. In addition, a suspension assembly 64 may raise or lower the filament guide as required by the scribing process.

According to the above-preferred embodiment, the stylus tip 24 initially rests at a roughly equal level to the filament guide 22. During the scribing process, the wire feeding mechanism 32 is actuated such that a section of filament is dispensed 102. The stylus tip 24 is lowered to press the filament 102 against the substrate 106. The filament guide 22 is positioned such that the filament 102 is trapped in the groove 26 of the stylus tip 24. The magnetostrictive transducer 54 is energized in order to apply energy to bond the filament 104 to the substrate 106.

The substrate 106 and filament guide 22 then are moved relative to one another in a pre-selected pattern. The wire feeder 32 and the filament guide 22 dispense a predetermined amount of filament 102 onto the substrate to form a filament circuit. The transducer assembly 50 is selectively actuated to bond the filament 104 to the substrate 106.

At termination points, a wire cutter 30 may be used to cut the filament.

At connection points, the transducer assembly 50 may be used to fuse the filament 104 to semiconductor devices 112 or other electrical or optical components.

When traversing a recessed feature such as a cavity 114, a raised feature such as a mounting pad or another wire 116, the sequence of events might work in the following fashion:

First, the controller 56 reduces the energy applied to bond the filament 102 and the substrate 106. For example, the ultrasonic energy source 58 is switched off or converted to an idling condition, and the pressure exerted by the stylus 24 to ensure intimate contact between the filament 102 and the substrate 106 is reduced. The wiring head 20 is also raised a distance in the Z-direction away from the substrate 106.

Second, the wiring head 20 is driven to a fixed Z-axis height above the obstacle 114 or 116 upon reaching the leading edge 110 of that obstacle. As the head 20 is moved up, DC current is applied to the feeder motor 34 to dispense filament 102, and the head 20 then traverses the obstacle 114 or 116. In this manner, the amount of filament 102 dispensed and the displacement of the head 20 are controlled according to the dimension of the obstacle 114 or 116.

After traversing the obstacle 114 or 116, the head 20 is lowered in the Z-axis direction toward the surface of the substrate 106 until the filament 102 contacts the substrate 106 and the stylus 26 exerts pressure thereon. The ultrasonic energy source 58 is energized and the sequence continues as it has been previously described until the filament 104 is adhered and the filament circuit 100 is complete and the cutter is activated.

Referring now to FIGS. 2a–2g, in scribing filaments 102 onto the substrate 106 with the device 10 such as shown in FIG. 1, the substrate 106 is fixed to a worktable 68 and associated with the wiring head 20. The movement of substrate 106 relative to the wiring head 20 is preferably controlled by automated means, such as a computer 66. The wiring head 20 may be stationary and the worktable 68 movable in three directions. Alternately, the wiring head 20 may be moveable in all three directions and the worktable stationary 68. The wiring head 20 and the worktable 68 may also both move in all three directions.

FIGS. 2A–2G illustrate the sequential steps used in creating an interconnection card with a filament circuit pattern 100 having planar and non-planar portions. As depicted, the present invention allows filament circuit patterns 100 to be scribed while reducing the stress applied to the filament at crossovers 107. The present invention also allows filament circuit patterns 100 to be scribed over pre-existing raised features 116 such as pads and contact patterns.

Figure 2A:
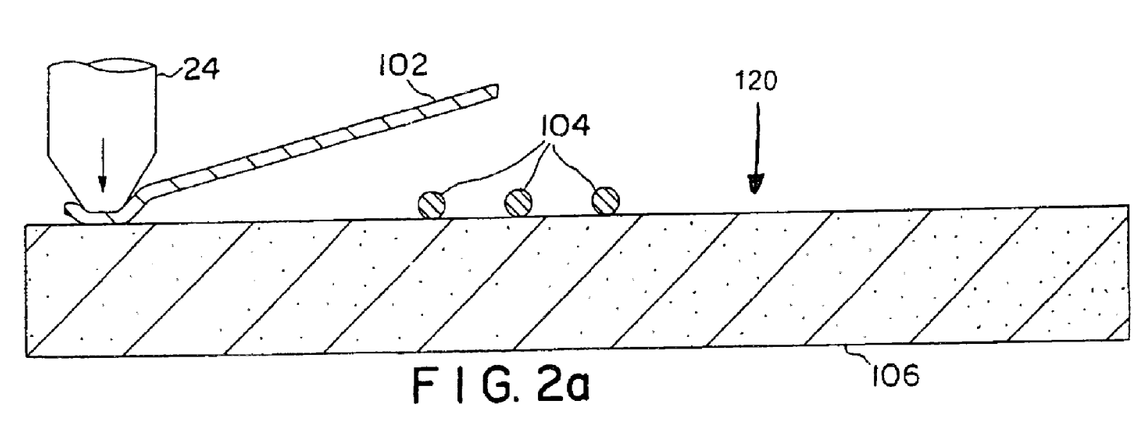
FIG. 2a is a plan view of a portion of a filament circuit board, wherein a filament is attached to a substrate.

An interconnection card 120 is shown in FIG. 2a in the initial steps of the wire-scribing process. The interconnection card 120 includes a substrate 106 with filaments 104 adhered to the surface of the substrate 106. The substrate 106 may contain a number of recessed features 114, such as pre-drilled holes, slots, cavities or the like. Pads, contact patterns or other raised features 116 may also be provided on the surface of the substrate 106.

Once filaments 104 have been scribed and adhered to substrate 106, as described above, those portions of the substrate occupied by these filaments 104 are denoted as "first pre-assigned areas." Areas of the substrate containing or assigned to contain recessed or raised features 114 or 116 may also be denoted as first pre-assigned areas. While subsequent filaments may traverse the previously scribed filaments, such subsequently scribed filaments are not bonded directly to the substrate 106.

Figure 2B:
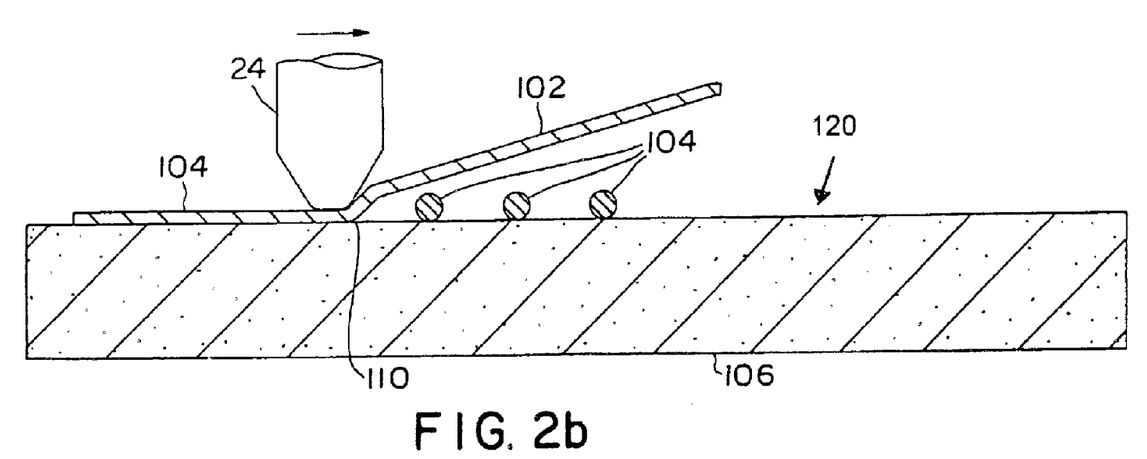
FIG. 2b is a plan view of the same portion of the filament circuit board shown in FIG. 2a, showing the further bonding of the filament to the substrate during filament circuit scribing.

Referring to FIG. 2b, the scribing stylus 24 and the substrate 106 are moved relative to one another in an X-Y plane parallel to the surface of the substrate 106, while dispensing and adhering the filament 104 to the surface of the substrate 106. When the stylus 24 reaches a leading edge 110 of a first pre-assigned area on the substrate 106 movement ceases. The stylus 24 to raised a distance in a Z-axis direction, perpendicular to the X-Y plane defined by the surface of the substrate, from the surface of the substrate 106.

Figure 2C:
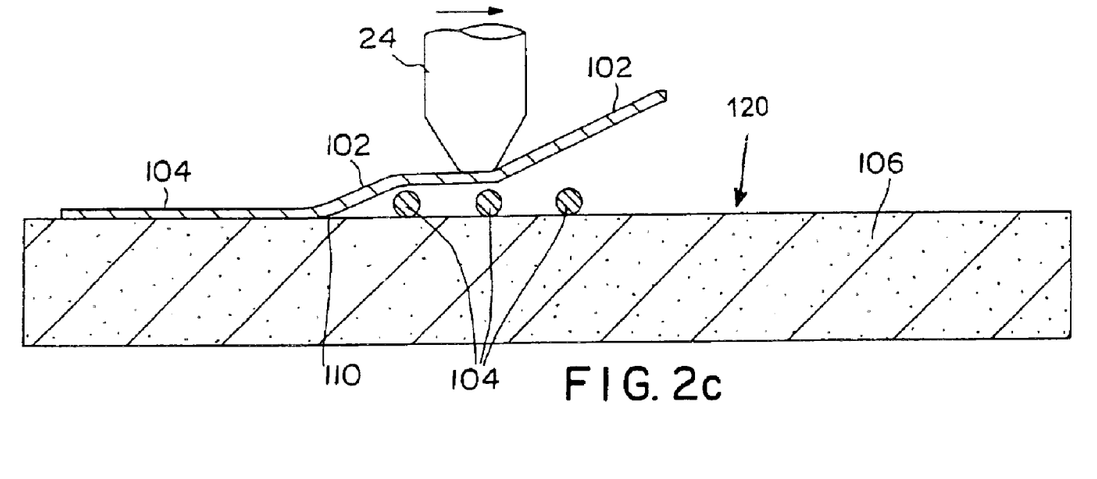
FIG. 2c is a plan view of the same portion of the filament circuit board shown in FIGS. 2a and 2b, further showing placement of a filament portion above previously scribed filament circuit portions.

As shown in FIG. 2c, the stylus 24 and the substrate 106 then are moved relative to one another, while the filament 102 is dispensed. Activation energy to activate the adhesive is may not be applied during this step. In this manner, subsequently scribed filaments 102 may traverse previously bonded filaments 104 without contacting them, and without be adhered to them.

Figure 2D:
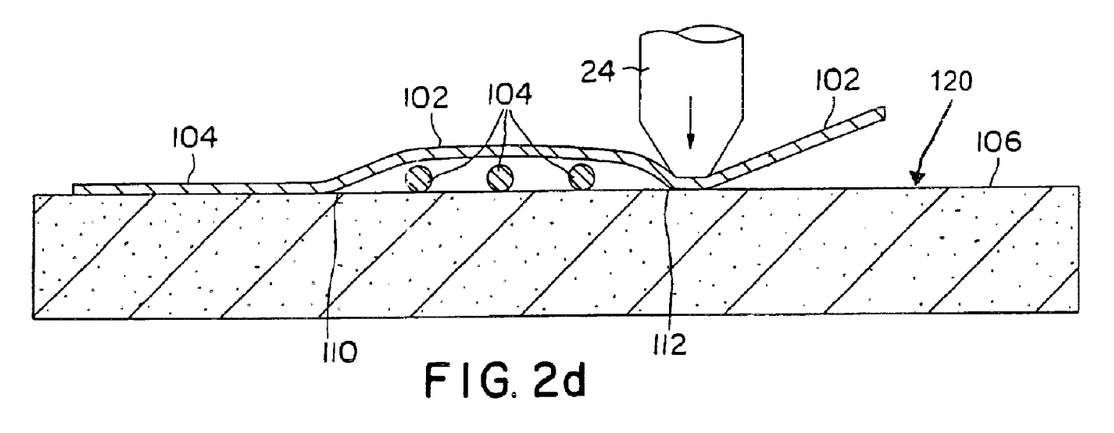
FIG. 2d is a plan view of the same portion of the filament circuit board shown in FIGS. 2a–2c, further showing the continuation of the bonding process after placing a filament portion above a majority of the filament circuit.
Figure 2E:
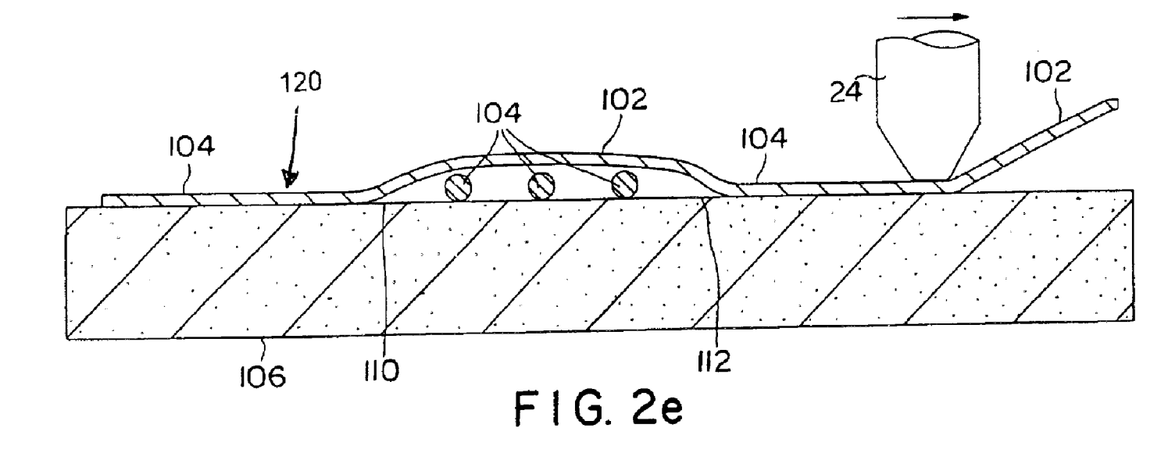
FIG. 2e is a plan view of the same portion of the filament circuit board shown in FIGS. 2a–2d, further showing the continuation of the filament-scribing process.

Referring to FIG. 2d, once the stylus 24 reaches a trailing edge 112 of the first pre-assigned area on the substrate 106, the stylus 24 is again moved in a Z-axis direction to bring the filament 102 into contact with the surface of the substrate 106. The application of energy to activate the adhesive is resumed and the filament 104 is adhered to the surface of the substrate 106. As shown in FIG. 2e, the stylus 24 and the substrate 106 are moved relative to one another while the filament 104 is dispensed and adhered to the substrate surface 106. This process continues under a complete filament circuit pattern 100 is formed.

Figure 2F:
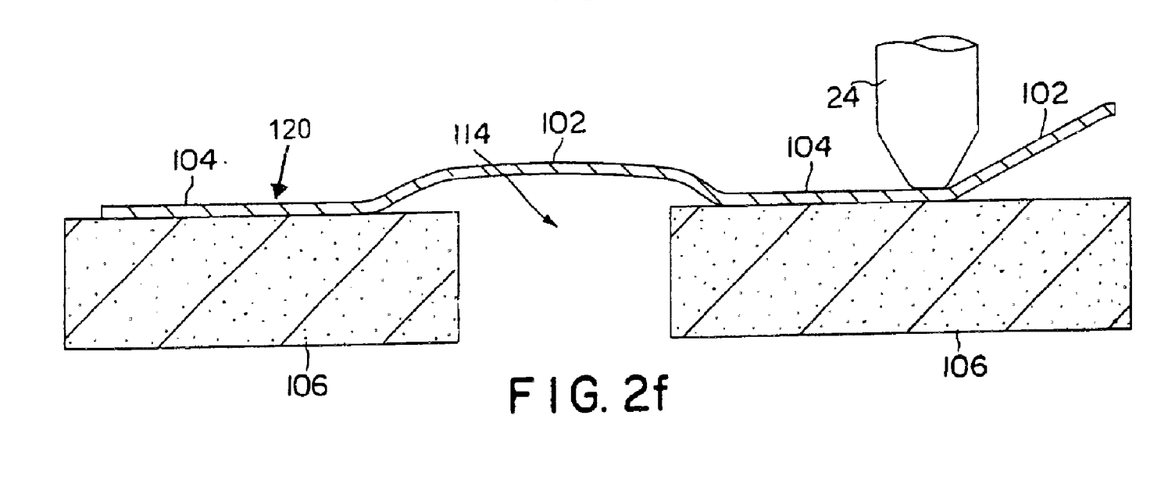
FIG. 2f is a plan view showing a portion of the filament circuit board showing placement of a filament portion above a recess of the substrate.
Figure 2G:
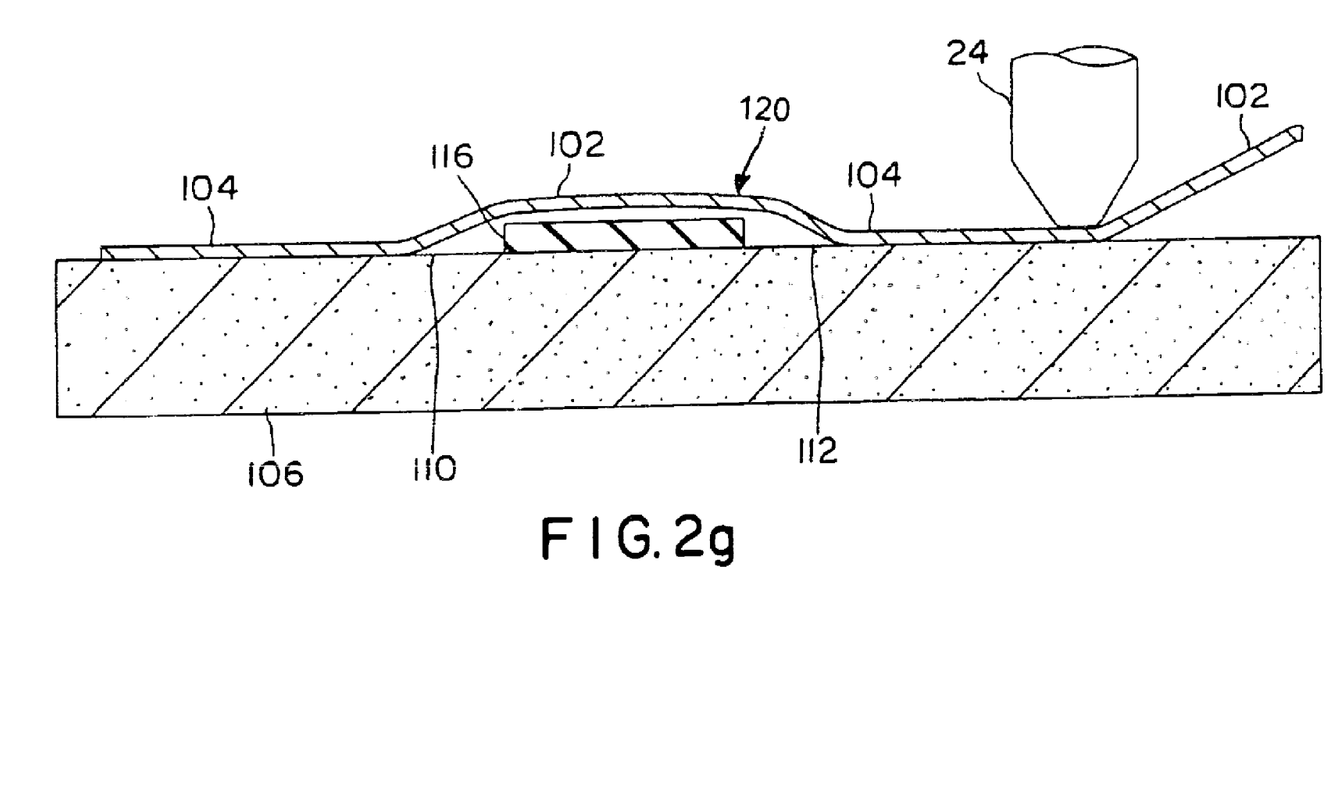
FIG. 2g is a plan view showing a portion of the filament circuit board showing placement of a filament portion above a raised feature of the substrate.

As shown in FIG. 2f, the procedure that is described above may be utilized to scribe an unbonded filament 102 over areas of the substrate 106, which contain a hole, a slot, a cavity or the like 114. FIG. 2g shows the same procedure utilized to scribe a filament 102 over an area of the substrate 106 with a raised feature 116, such as a pad or contact pattern.

FIGS. 3a–3f illustrate the sequential steps used in creating an interconnection card 120 with non-planar portions of the filament circuit pattern 100 comprises of lengths of filament 105 embedded into the substrate 106 a Z-axis direction below the X-Y plane defined by the substrate surface 106. As depicted, the present invention allows filament circuit patterns 100 to be scribed while reducing the stress applied to the filament at crossovers 107. The present invention also allows filament circuit patterns 100 into recessed features 114 of the substrate 106.

Figure 3A:
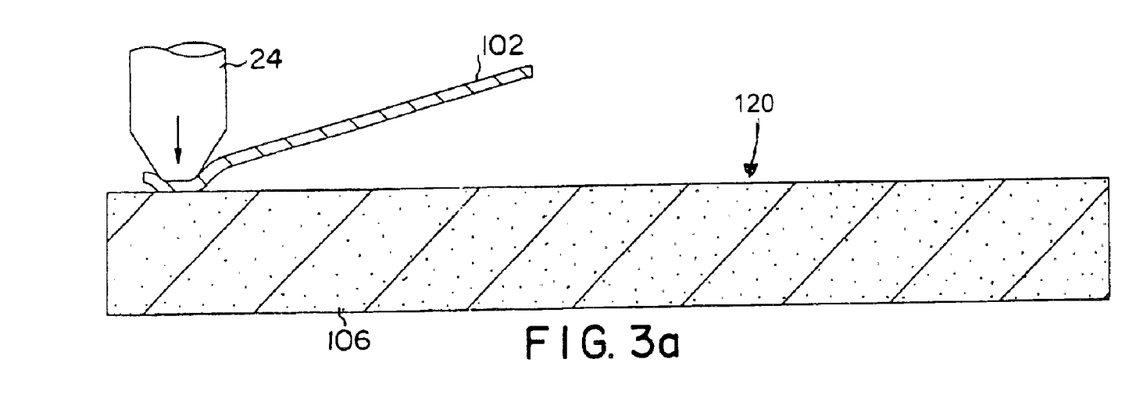
FIG. 3a is a plan view of a portion of a filament circuit board, wherein a filament is attached to a substrate.

An interconnection card 120 is shown in FIG. 3a in the initial steps of the wire-scribing process. A filament 102 is fed onto the substrate surface 106. The scribing stylus 24 is moved in the Z-axis direction toward the substrate surface 106 to bring the filament 102 and the substrate surface 106 into contact with one another. Simultaneously or subsequently, energy is applied to the filament 102 or the substrate or both to activate an adhesive surface. In this manner, the filament 104 is bonded to the substrate surface 106.

Figure 3B:
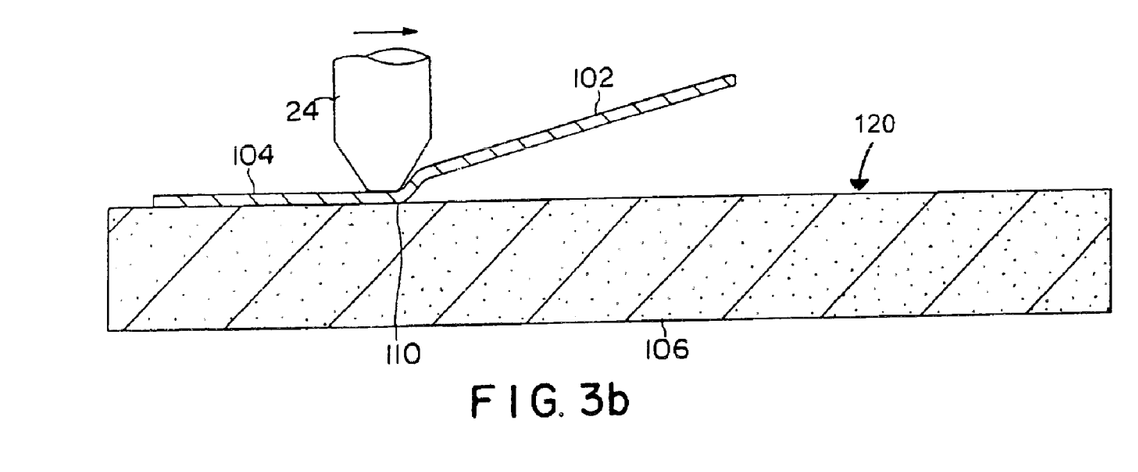
FIG. 3b is a plan view of the same portion of the filament circuit board shown in FIG. 3a, showing the further filament bonding to the substrate during filament circuit scribing.

Referring to FIG. 3b, the scribing stylus 24 and the substrate 106 are moved relative to one another, while the filament 102 is dispensed onto the substrate surface 106. As the filament 102 contacts the substrate surface 106, it is adhered thereto, as described above.

Areas of the substrate 106 may be denoted as "second pre-assigned areas." These areas may include crossovers 107. At a leading edge 110 of the second pre-assigned area on the substrate 106, movement of the stylus 24 and the substrate 106 relative to one another ceases. The stylus 24 and the substrate 106 then are moved closer to one another in the Z-axis.

Figure 3C:
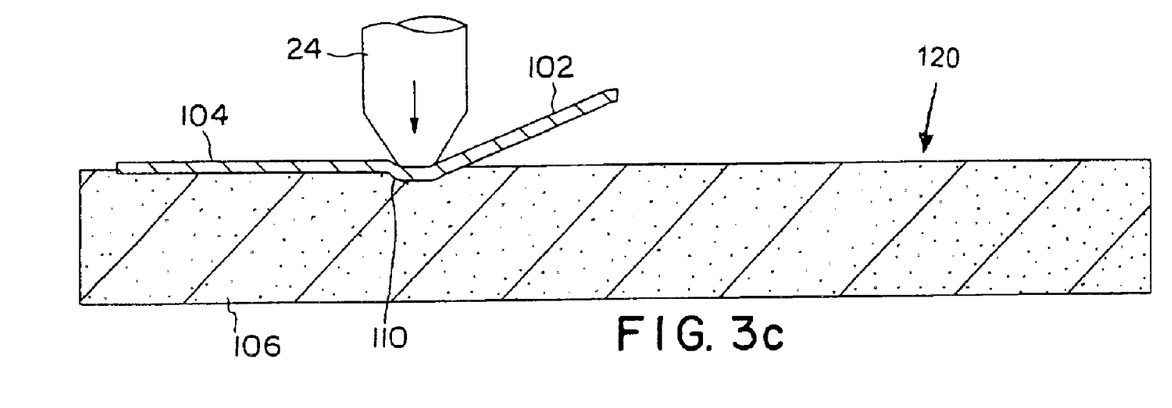
FIG. 3c is a plan view of the same portion of the filament circuit board shown in FIGS. 3a and 3b, further showing placement of a filament portion below previously scribed filament circuit portions.

Referring to FIG. 3c, the stylus 24 is moved downward in a controlled and pre-selected manner in the Z-axis to embed the filament 105 below the surface of the substrate. The activation energy to activate the adhesive may be increased during this step. Then, the stylus 24 and the substrate 106 are moved relative to one another in the X and Y-axis directions.

Figure 3D:
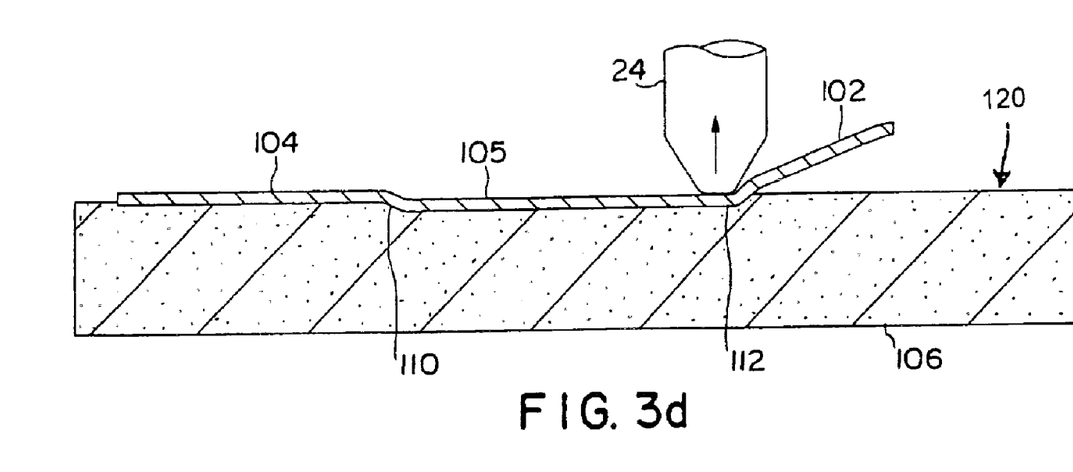
FIG. 3d is a plan view of the same portion of the filament circuit board shown in FIGS. 3a–3c, further showing the continuation of the bonding process while placing a filament portion below a majority of the filament circuit.
Figure 3E:
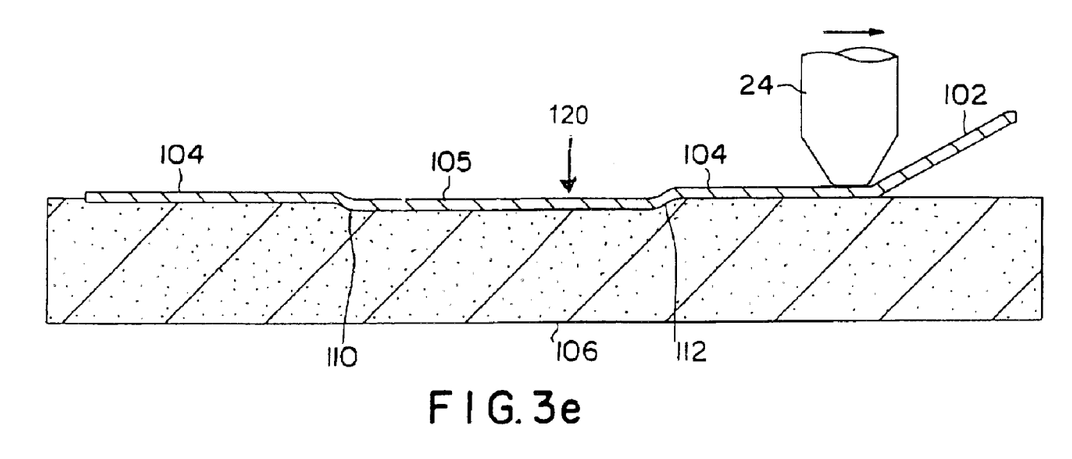
FIG. 3e is a plan view of the same portion of the filament circuit board shown in FIGS. 3a–3d, further showing the continuation of the bonding process by resumption of scribing on the substrate's surface.

Referring to FIG. 3d, once the stylus 24 reaches a trailing edge 112 of the second pre-assigned area on the substrate 106, the stylus 24 and the substrate 106 are moved relative to one another in the Z-axis direction to bring the filament 102 into contact with the substrate surface 106. The application of energy to activate the adhesive is resumed and the filament 104 is adhered to the substrate surface 106. As shown in FIG. 3e, the stylus 24 and the substrate 106 are moved relative to one another while the filament 104 is dispensed and adhered to the substrate surface. This process continues until a complete filament circuit pattern 100 is formed.

Figure 3F:
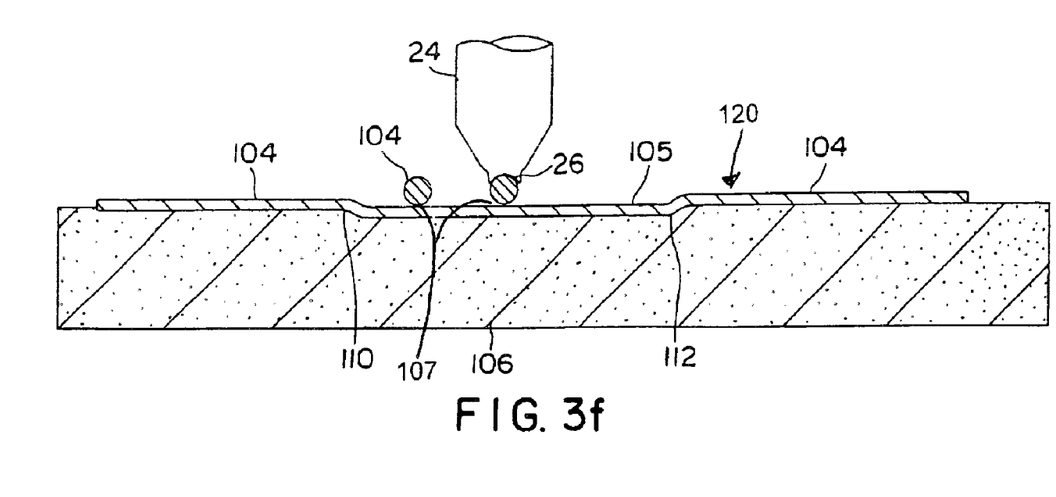
FIG. 3f is a plan view of the same portion of the filament circuit board shown in FIGS. 3a–3e, further showing the continuation of the bonding process by scribing additional filament portions onto the embedded filament portion.

As shown in FIG. 3f, a second filament 104 may be placed onto the embedded filaments 105, those filaments previously adhered in a second plane located below the substrate surface 106. At those points where the second filament 104 intersects with the embedded filament 105, however, the application of energy to activate the adhesive surface is not terminated. Instead, the second filament 104 is adhered over top of the embedded filament 105. In this way, the second filament 104 remains in the same X-Y plane as the majority of the filament circuit pattern 100, crossing over embedded filaments 105.

Figure 4:
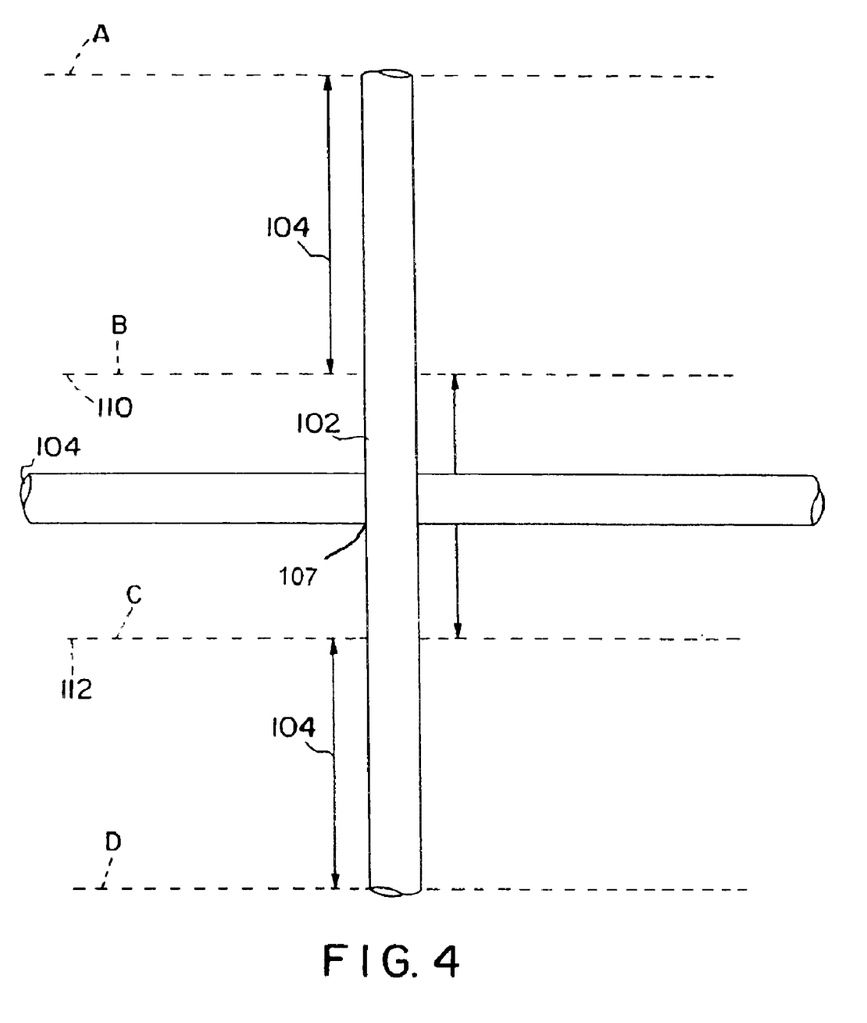
FIG. 4 is an overhead view of a crossover formed according to the present invention.

FIG. 4 is an overhead view of a crossover formed according to the present invention. A first wire 104 is bonded to the substrate surface as described above. A second wire 104 is similarly bonded in the same X-Y plane as the first wire from line A to line B. At line B, denoting a leading edge 110 of a first pre-assigned area, the stylus 24 and substrate 106 are moved away from one another in the Z-axis direction. The stylus 24 is moved from line B to line C, denoting a trailing edge 112 of the first pre-assigned area, and additional filament is dispensed 102. At line C, the stylus 24 and the substrate 106 are moved closer to one another in the Z-axis direction. Energy is applied to activate the adhesive and bond the filament 104 to the substrate surface 106. The stylus 24 and the substrate 106 then are moved relative to one another in the X-Y plane while the filament 104 is dispensed and adhered onto the surface of the substrate 106, as described above. Accordingly, a three-dimensional filament circuit is formed.

The present invention relates to a particularly advantageous method of forming an optical filament circuit pattern having planar and non-planar portions on or in the vicinity of a surface of a dielectric substrate. The optical filament bonding process is sophisticated. The present invention is designed to move a optical filament bonding head assembly quickly across a substrate in a predetermined path and, while doing so, to dispense and ultrasonically bond the optical filament to the surface of the substrate. This requires that both the action of the motor used to dispense the optical filament and the amount of ultrasonic energy generated be very precisely controlled and modulated in proportion to relative velocity of the bonding mechanism. In addition, the behavior of that mechanism in terms of its rotation and Z-axis movement also must be controlled and precisely coordinated with other system functions. As explained below, using specified amounts of ultrasonic power and stylus pressure, the present invention achieves wire-scribing speeds that are 50% faster than previously achievable. Moreover, bond strengths between the optical filament and the substrate are strong, even at these fast scribing speeds.

If the scribing speed is set too high, the filament may not be securely bonded to the substrate. This produces a non-robust, optical filament circuit board that is not acceptable. In addition, high scribing speeds can cause optical filament breakage, which also is not acceptable. However, it is important to increase scribing speeds to increase manufacturing productivity.

The bond strength between the filament and the substrate preferably is between about 7 grams and about 14 grams, more preferably between about 9 grams and about 12 grams and more preferably between about 10 grams and about 11 grams.

In this aspect, the present invention is a three-step method. First, a pre-selected length of a continuous and optically conductive filament is scribed in a plane parallel to the surface of the substrate and on or in the vicinity of a surface of a substrate. This forms a planar portion of the circuit pattern. Preferably, during this scribing step, the wiring head 20 and the substrate are moved relative to one another at a speed between about 110 inches/minute and about 190 inches/minute, and more preferably at a speed between 130 inches/minute and about 170 inches/minute and most preferably at a speed of about 150 inches/minute. To achieve these speeds while also meeting the conflicting goals of (1) ensuring a secure bond between the optical filament and the substrate and (2) avoiding breakage of the fragile optical filament, an appropriate bonding energy is selected.

Specifically, the optical filament is bonded to the substrate, preferably by application of ultrasonic power. More preferably, both ultrasonic power and pressure are applied during scribing. When ultrasonic power is applied during the scribing process, a current is used that is between about 1.2 amps and about 1.4 amps, and most preferably between about 1.3 amps and about 1.4 amps. Also, the ultrasonic power has an idle voltage that is between about 1 volt and 2 volts. The run voltage that is between 11 and 12 volts. Further, the run wattage that is between about 2.0 watts and about 3.5 watts, and preferably is between about 2.5 watts and about 3.0 watts.

If pressure is applied during the scribing process, the pressure applied preferably is between about 1.200 Newtons and about 1.324 Newtons, and most preferably is between about 1.275 Newtons and about 1.324 Newtons.

Second, a non-planar portion of the circuit pattern is formed. The wiring head 20 (along with its aforementioned filament guide 22, stylus 24, and bonding transducer assembly 50) are moved in planar and non-planar directions. Accordingly, the optical filament, which is held by the filament guide 22, also is moved in planar and non-planar directions. The optical filament is dispensed from the wiring head to place the next length of continuous optical filament. This next length traverses but does not adhere to a pre-selected surface or feature forming part of the surface of the substrate. To accomplish this crossing without bonding, the pressure on the optical filament during crossing preferably is reduced to between about 0.333 and about 0.353 Newtons. The avoids breakage of the optical filament due to high stresses.

Third, a plane parallel to the surface of the substrate is scribed. Specifically, on or in the vicinity of a surface of a substrate a next pre-selected length of the continuous filament that is contiguous to the length of the filament that forms the non-planar portion of the filament circuit is bonded to the substrate to form another planar portion of the circuit. Again, the scribing process and the bonding of the optical filament to the substrate are achieved as described in the first step above (e.g., by application of ultrasonic power and pressure). Practicing the above-described method permits scribing of a three-dimensional optical filament circuit at speeds between about 110 inches/minute and about 190 inches/minute, and more preferably at a speed between 130 inches/minute and about 170 inches/minute and most preferably at a speed of about 150 inches/minute.

EXAMPLE 1

An apparatus as described above is used with optical filament to make a scribed filament circuit pattern with planar and non-planar portions. For example, a COILPRO™ 2000 series wiring machine or a COILPRO™ 4000 series wiring machine, both available from Advanced Interconnection Technology, L.L.C. (a Stratos Lightwave company) of Hauppauge, N.Y., can be used.

The substrate is a polyimide film commercially available from DuPont, Inc. (Wilmington, Del.) under the trademark KAPTON® 200HN, and is 50 $\mu$m thick. The substrate is prepared by bonding a layer of adhesive to one surface. The adhesive is an acrylic resin commercially available from 3M (St. Paul, Minn.) under the trademark VHB™ Adhesive Transfer Tape. The adhesive is 250 $\mu$m thick. The adhesive is bonded to the substrate using a roll laminator. To accomplish this, the two films are aligned to one another and passed between the rollers of the laminator. The compliant rollers squeeze the materials together.

The optical filament is a single mode fiber commercially available from Corning Incorporated (Corning, N.Y.) under the trademark SMF-28™ Fiber. The fiber has a core of silica, a cladding also of silica and a buffer coat of acrylic. The diameter of the core is nominally 9 $\mu$m, while the diameter of the composite at the outside of the cladding is 125 $\mu$m±1 $\mu$m. The overall diameter of the fiber (including the buffer coat) is 245 $\mu$m.

The optical filament is bonded to the substrate is a series of parallel lines, approximately 40 cm in length, using ultrasonic power having a current of 1.3–1.4 amps, an idle voltage of between 1 and 2 volts, a run voltage of 11–12 volts and a run wattage of 2.0–3.5 watts.

In addition to the ultrasonic power, pressure is applied to the optical filament. To embed the optical filament into the substrate, pressures between 1.275 and 1.324 Newtons are applied. When the optical filament "jumped" or traversed another feature (e.g., another segment of fiber, or an optical component), a lower pressure between 0.333 and 0.353 Newtons is applied.

Under these conditions, the apparatus is capable of scribing the optical filament at a velocity of 150 inches/minute.

COMPARATIVE EXAMPLE 1

The same apparatus, substrate and optical filament is as in Example 1, except that the bonding of the optical filament is achieved using different conditions. Specifically, the ultrasonic power has a current of 1.1–1.2 amps, an idle voltage less than 1 volt, a run voltage of 10–11 volts and a run wattage of 1.6–2.0 watts. Again, the optical filament is bonded to the substrate is a series of parallel lines, approximately 40 cm in length.

Pressure is applied to the optical filament. To embed the optical filament into the substrate, a pressure of about 1.177 Newtons is applied. When the optical filament "jumped" or traversed another feature (e.g., another segment of fiber, or an optical component), a lower pressure between 0.333 and 0.353 Newtons is applied.

Under these conditions, the apparatus was capable of scribing the optical filament at a velocity of 100 inches/minute.

COMPARATIVE TESTING

The strength of the bond developed in Example 1 and Comparative Example 1 is quantitatively measured using an Instron® Model #1130 Stress Tester. One end of each fiber is securely clamped within the pulling mechanism of the Instron machine. The fiber is pulled perpendicularly free from the surface of the substrate at a strain rate of 10 inches/minute. The force required to do so, in grams, is recorded. The results are summarized below.

|  | Comparative Example 1 | Example 1 |
|---|---|---|
| Average Bond Strength (all recorded data) | 5.1 grams | 9.6 grams |
| Absolute Minimum Bond Strength Observed | 3.0 grams | 7.0 grams |
| Absolute Maximum Bond Strength Observed | 7.0 grams | 14.0 grams |

In addition, each bonded fiber is inspected along its length visually using 20× optical magnification prior to the bond strength testing. There is no indication that any physical or mechanical damage is caused by use of either parameter set.

These results are unexpected since a rather minor increase in ultrasonic power and stylus pressure yields both a 50% increase in bonding velocity and nearly a doubling of bond strength. This translates directly into substantially higher productively and superior product quality since the fibers are more securely bonded and, therefore, far less likely to become dislodged or moved during subsequent processing of the optical circuits.

As illustrated and described above, the invention can be implemented by various embodiments. The invention, in its broader aspects, is not limited to the specific embodiments herein shown and described. Departures may be made therefrom within the scope of the accompanying claims without departing from the principles of the invention, and without sacrificing its chief advantages.

What is claimed is:

1. A method of forming an optical filament circuit pattern having planar and non-planar portions on or in the vicinity of a surface of a dielectric substrate, the method comprising:

scribing at a speed between 110 inches/minute and 190 inches/minute a pre-selected length of a continuous optically conductive filament in a plane parallel to the substrate surface and on or in a vicinity of the substrate surface to form a planar portion of the circuit pattern from the scribed length of filament;

forming a non-planar portion of the circuit pattern by controllably moving the filament in planar and non-planar directions and placing a next pre-selected length of the continuous filament that is contiguous to the immediately preceding scribed length so that the next pre-selected length of filament traverses but does not adhere to a pre-selected surface or feature forming part of the substrate surface; and scribing at a speed between 110 inches/minute and 190 inches/minute in a plane parallel to the substrate surface, and on or in a vicinity of the substrate surface a next pre-selected length of the continuous filament that is contiguous to the length of the filament that forms the non-planar portion of the filament circuit to form another planar portion of the circuit, wherein a bond strength between the optical filament and the substrate is achieved of between 7 grams and 14 grams.

2. The method of claim 1, wherein the substrate or the filament or both have an adhesive surface capable of being activated by application of energy, and wherein scribing steps (a) and (c) comprise:

feeding the filament to a filament guide, while moving the filament guide and the substrate relative to each other, so that a length of filament is dispensed from the filament guide onto the surface of the substrate in the filament circuit pattern; and simultaneously or subsequently applying energy capable of activating the adhesive surface of the substrate and/or the filament forming a pre-selected circuit path, so that the filament adheres to the substrate in the filament circuit pattern.

3. The method of claim 2, wherein the filament guide and the substrate are moved relative to each other at a speed of about 150 inches/minute.

4. The method of claim 3, wherein the filament guide is moved relative to the substrate and the substrate is kept stationary.

5. The method of claim 3, wherein the substrate is moved relative to the filament guide and the filament guide is kept stationary.

6. The method of claim 5, wherein the step of applying energy comprises applying energy in a form selected from a group consisting of heat, ultrasound, pressure, and combinations thereof.

7. The method of claim 6, wherein the step of applying energy to activate the adhesive surface comprises ultrasonic energy to the surface.

8. The method of claim 6, wherein the step of applying energy to activate the adhesive surface comprises heating the surface to within a temperature range of 90° and 160° F.

9. The method of claim 2, wherein the step of applying energy comprises applying ultrasound energy having an output power between 2.0 watts and 3.5 watts.

10. The method of claim 9, wherein the ultrasound energy has an output power between about 2.5 watts and about 3.0 watts.

11. The method of claim 9, wherein the step of applying energy further comprises applying a pressure to the filament between 1.177 Newtons and 1.324 Newtons.

12. The method of claim 11, wherein the pressure between about 1.275 Newtons and about 1.324 Newtons.

13. The method of claim 1, wherein step (b) comprises:

interrupting the application of energy so that the filament does not adhere to the pre-selected surface, or feature forming part of the surface, of the substrate;

moving a filament guide and the substrate away from each other in a Z-axis direction perpendicular to the plane defined by the surface of the substrate;

traversing the pre-selected surface, or feature forming part of the surface, of the substrate by moving the filament guide and the substrate relative to each other in a plane parallel to the plane defined by the surface of the substrate, while feeding the filament to the filament guide so that the next pre-selected length of the continuous filament is dispensed over, but does not contact the pre-selected surface, or feature forming part of the surface, of the substrate; and moving the filament guide and the substrate closer to each other in the Z-axis direction until the filament guide is positioned in a plane defined by the planar portion of the circuit pattern.

14. A method of optical filament scribing comprising:

scribing at a speed between 110 inches/minute and 190 inches/minute a pre-selected continuous length of an optical filament to a surface of a thermoplastic substrate to form a filament circuit pattern having a pre-determined path; and applying sufficient energy to the filament or substrate to achieve a bond strength between the filament and the substrate between 7 grams and 14 grams.

15. The method of claim 14, wherein the filament circuit pattern has at least one crossover.

16. The method of claim 15, wherein the scribing step comprises:

scribing a first substantially planar portion of the filament circuit pattern by controllably moving and placing a pre-selected length of the continuous filament in a plane parallel to the substrate surface to form; and scribing a substantially non-planar portion of the filament circuit pattern by controllably moving the filament in planar and non-planar directions and placing a next pre-selected length of the continuous filament that is contiguous to the immediately preceding scribed length so that the next pre-selected length of filament traverses but does not adhere to a pre-selected surface or feature forming part of the substrate surface; and scribing a second substantially planar portion of the filament circuit pattern by controllably moving in a plane parallel to the substrate surface and placing a next pre-selected length of the continuous filament that is contiguous to the length of the filament that forms the non-planar portion of the filament circuit.

17. An apparatus for optical filament scribing comprising:

means for scribing at a speed between 110 inches/minute and 190 inches/minute a pre-selected continuous length of an optical filament to a surface of a thermoplastic substrate to form a filament circuit pattern having a pre-determined path; and means for applying sufficient energy to the filament or substrate to achieve a bond strength between the filament and the substrate between 7 grams and 14 grams.

* * * * *